United States Patent [19]

Scheuerlein et al.

[11] Patent Number: 4,506,351

[45] Date of Patent: Mar. 19, 1985

[54] ONE-DEVICE RANDOM ACCESS MEMORY HAVING ENHANCED SENSE SIGNAL

[75] Inventors: Roy E. Scheuerlein, Burlington, Vt.; Seiki Ogura, Hopewell Junction, N.Y.

[73] Assignee: International Business Machines Corporation, Armonk, N.Y.

[21] Appl. No.: 391,333

[22] Filed: Jun. 23, 1982

[51] Int. Cl.³ .................. G11C 7/00; G11C 11/24; G11C 11/40
[52] U.S. Cl. .................................. 365/205; 365/149; 365/207
[58] Field of Search ................ 365/205, 207, 208, 149

[56] References Cited

U.S. PATENT DOCUMENTS

| 3,196,405 | 7/1965 | Gunn | 340/173 |
|---|---|---|---|
| 3,387,286 | 6/1968 | Dennard | 340/173 |
| 3,699,537 | 10/1972 | Wahlstrom | 340/173 R |
| 3,838,404 | 9/1974 | Heeren | 340/173 DR |
| 3,876,992 | 4/1975 | Pricer | 340/173 CA |
| 3,986,180 | 10/1976 | Cade | 340/173 CA |
| 4,027,294 | 5/1977 | Meusburger et al. | 340/173 CA |
| 4,188,671 | 2/1980 | Lynes | 365/149 |
| 4,367,540 | 1/1983 | Shimohigashi | 365/207 |

FOREIGN PATENT DOCUMENTS 55-45170  3/1980  Japan .

OTHER PUBLICATIONS

Lee, "Cross-Coupled Latch for Memory Sensing", IBM Tech. Disc. Bul., vol. 17, No. 5, 10/74, pp. 1361-1362.

IBM Technical Disclosure Bulletin, vol. 23, No. 6, Nov. 1980, "One-Device Memory Cell Arrangement with Improved Sense Signals", L. Arzubi & W. D. Loehlein, pp. 2331-2332.

Primary Examiner—Stuart N. Hecker
Assistant Examiner—Glenn Gossage
Attorney, Agent, or Firm—Mitchell S. Bigel; Anne Vachon Dougherty

[57] ABSTRACT

An improved one-device random access memory comprises an array of memory cells arranged in rows and columns. Each cell comprises a transistor and a capacitor, with one of the transistors controlled electrodes being connected to one of the capacitor plates. The controlling electrodes of all the transistors in a column are connected to a word line. The other controlled electrodes of all the transistors in a row are connected to a bit line, while the other plate of all the capacitors in a row are connected to a sense line. Each row also includes a differential sense amplifier coupled between the bit and sense lines. Each row also includes a dummy cell connected to the sense line, the dummy cell having a capacitor of the same sense as the cell capacitor, and storing the same charge thereon as a cell capacitor.

The memory is fabricated on a semiconductor substrate, and the bit line capacitance is made substantially greater than the sense line capacitance. The memory also includes bit and sense line load isolators between respective bit and sense lines and the sense amplifiers. The bit line load isolators are controlled in a manner which provides an automatic refresh of sensed data. The sense line load isolators are controlled to prevent unselected cells from being disturbed during the refresh operation.

19 Claims, 3 Drawing Figures

ONE-DEVICE RANDOM ACCESS MEMORY HAVING ENHANCED SENSE SIGNAL

TECHNICAL FIELD

This invention generally relates to an improved random access memory and more particularly to an improved random access memory, each cell of which comprises a single active device and a charge storage device.

Random access memories are widely employed for storing binary data in a data processing system. Typically, a random access memory comprises an array of cells arranged in a predetermined number of words, each word comprising a predetermined number of cells, with one bit being stored per cell. Data is typically written into or read from the memory by selecting one word and writing or reading all of the cells in the selected word.

Present day data processing applications require ever increasing processing speeds coupled with reduced processor size and power consumption. As such, the design of random access memories has focused on increasing read/write speed, decreasing area and reducing power consumption.

BACKGROUND ART

One currently favored class of random access memory employs the so-called "one-device" cell. Disclosed as early as 1968, for example, in U.S. Pat. No. 3,287,286 to Dennard, the one-device cell has found favor among memory designers because of its small cell size, high speed, and low power dissipation. Basically, the one-device cell includes a single active device (typically a bipolar or field effect transistor) and a single charge storage device (typically a capacitor). The active device's controlling electrode (i.e., the base or gate) is connected to a word line for selecting the cell. One of the active device's controlled electrodes (i.e., the bipolar transistor's emitter or collector or the field effect transistor's drain or source) is connected to one of the capacitor plates. The other capacitor plate is connected to a fixed potential, typically ground or the memory power supply voltage. Finally, the other of the active device's controlled electrodes is connected to a bit line. A sense amplifier is also connected to the bit line for sensing the binary data stored in the cell.

The binary state of the one-device cell is determined by the charge stored on the capacitor thereof. For example, the presence of charge on the capacitor may signify a logical ZERO while the absence of charge on the capacitor may signify a logical ONE. During the standby state, the controlling electrode (i.e., the base or gate) is disabled so that the active device is off, and acts as a high impedance to prevent capacitor discharge. Data is read (sensed) by turning on the active device, which permits the capacitor to discharge onto the bit line to which the active device is connected. This charge is sensed by the sense amplifier connected to the bit line.

Many of the desirable memory characteristics discussed above are inherent in a memory comprising one-device cells (hereinafter referred to as a "one-device memory"). For example, only two components per cell are needed, thus occupying minimal integrated circuit chip "real estate". The one-device memory is also high speed because of the rapid capacitor charge/- discharge rate. Finally, no power is dissipated during the standby state.

Recently, an attempt has been made to extract even greater performance from the one-device memory by tying the normally grounded capacitor plate to a line which runs parallel to the bit line, and differentially sensing the read signal between the added line and the original bit line. As shown in IBM Technical Disclosure Bulletin, Vol. 23, No. 6, pp. 2331-2332 (November 1980), the one device cells are located between a pair of bit lines which are connected to the respective nodes of a differential sense latch. This causes a differential signal to be applied to the sense latch, and eliminates reference signals or dummy cells. To ensure balanced bit line capacitances, each bit line is divided into equal alternating portions of polysilicon and diffused sections, and alternate pairs of cells in a row are inverted by interchanging the location of the cell's active device and charge storage device.

By utilizing the charge stored on both plates of the capacitor, rather than dissipating the charge on one plate into ground, the above identified Technical Disclosure Bulletin increases the sense signal from the cell. However, this increased sense signal must not occur at the expense of memory reliability. For example, it must be assured that the data in an unselected cell is not disturbed during a read/write operation from a selected cell. Moreover, an arrangement must be found for maximizing the increased sense signal which is available from the differentially sensed cell. In short, there is a need for a new one-device memory arrangement which takes maximum advantage of the increased signal which may be obtained by adding a line to the normally grounded capacitor plate and differentially sensing the signal between the bit line and the added line.

DISCLOSURE OF THE INVENTION

It is therefore a primary object of this invention to provide an improved one-device memory.

It is another object of the invention to provide a one-device memory which produces an enhanced sense signal.

It is a further object of the invention to provide an enhanced sense signal one-device memory which preserves data integrity of unselected cells.

These and other objects are accomplished by a one-device memory comprising an array of memory cells arranged in a plurality of rows and columns. Each cell comprises a transistor (e.g., a field effect transistor) having a controlling (gate) electrode and a pair of controlled (source and drain) electrodes and a charge storage device (e.g., a capacitor), having a pair of plates. One of the controlled electrodes is connected to one of the capacitor plates. The controlling electrodes of all the cells in a respective column are connected to a word line for cell selection. The other controlled electrodes of all the cells in a respective row are connected to a bit line. The other capacitor plates of all the cells in a respective row are connected to a sense line. Connecting all the transistors in a row to the bit line and all the capacitors to the sense line assures that the data in unselected cells is not disturbed as the bit line potential is changed during a read/write operation. Undisturbed unselected cells may not be assured when some of the cells in a row are inverted.

The capacitance of the bit and sense lines are also deliberately made unequal, in order to maximize the sense signal. More particularly, the sense line capacitance is rendered substantially smaller than the bit line capacitance (e.g., by a factor of 2:1). In a preferred embodiment this may be accomplished by fabricating the bit lines at least partially as a diffusion region while fabricating the sense line substantially from doped polysilicon. This deliberate unbalancing of the bit and sense line capacitance increases the size of the sense signal compared to an arrangement where the line capacitances are balanced.

The bit line and sense line associated with an array row are connected to the differential nodes of a sense amplifier, so that the signal between the lines may be sensed. Interposed between the bit line and the sense amplifier is a bit line load isolator. Interposed between the sense line and the sense amplifier is a sense line load isolator. During a sense (read) operation, the bit line load isolator is controlled in a manner which provides an automatic refresh of the sensed data. The sense line load isolator is independently controlled in a manner which prevents the sense line voltage from dropping sufficiently low to disturb unselected cells. Thus data integrity is preserved while allowing the memory to be self-refreshing.

In a preferred embodiment, each row has a dummy cell associated therewith. The dummy cell is employed for equalizing the sense signal for a stored binary ONE and ZERO. The dummy cell comprises a first transistor, a charge storage device and a second transistor for preconditioning the potential on the charge storage device. One plate of the charge storage device is connected to one of the first transistor's controlled electrodes, while the other plate is connected to a fixed potential. The first transistor's other controlled electrode is connected to the sense line only. In contrast with prior arrangements, the dummy cell capacitance and the memory cell capacitance are substantially equal, thus rendering it easy to fabricate the memory cells and dummy cells on a single semiconductor substrate. Moreover, the charge stored in a dummy cell is substantially equal to the charge stored in a memory cell so that the dummy cells may be controlled by the same voltage levels as the memory cells.

BEST MODE FOR CARRYING OUT THE INVENTION

Figure 1:
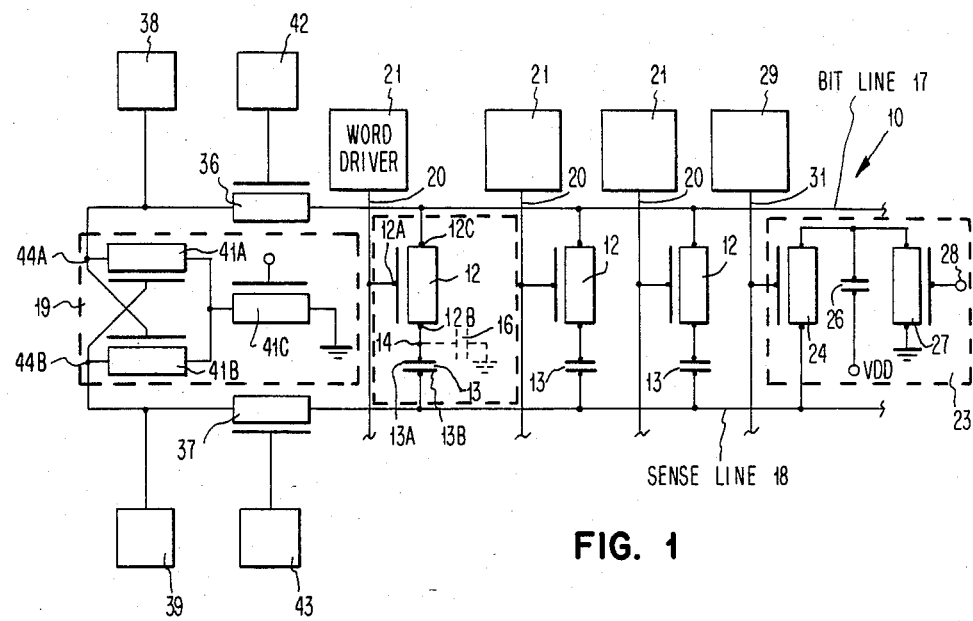
FIG. 1 illustrates schematically a random access memory in accordance with the present invention.

Referring now to FIG. 1, a schematic of a word organized random access memory according to the present invention is shown. Random access memory 10 includes three memory cells, 11, arranged in one row and three columns. It will be understood by those having skill in the art that actual random access memories according to the present invention may have 256 rows and 64 columns, or more, and are formed on an integrated circuit chip.

Each cell 11 includes a single active switching device, 12, here a field effect transistor (FET), having a controlling (gate) electrode 12A and a pair of controlled (source, drain) electrodes 12B, 12C. One of the controlled electrodes 12B (i.e., the source or drain) is connected to one of the plates 13A of charge storage device 13 (here a capacitor), at internal storage node 14. Of course, associated with internal storage node 14 is stray capacitance 16.

Cells 11 are connected in an array as follows: The controlling electrodes 12A of all the cells in a column are connected to a word line 20. Each word line 20 is driven by a word driver 21. The controlled electrode 12C (i.e., the other of the source or drain) of all the cells in a row are connected to a bit line 17. The other plate 13B of all the cells in a row are connected to a sense line 18. Thus, as illustrated in FIG. 1, all FETs in the array are connected to the bit lines 17 while all the capacitors in the array are connected to sense lines 18. Connection of all the cells in the above described manner is essential in order to preclude disturbing the charge stored in an unselected cell during a read/write operation, as will be explained in greater detail below.

Bit lines 17 and sense lines 18 run generally parallel to each other in an interleaved manner and perpendicular to word lines 20. The bit line 17 and sense line 18 associated with a given row are coupled to a sense amplifier 19, which senses the voltage difference between bit line 17 and sense line 18, at nodes 44A and 44B, respectively, to provide an enhanced signal, as will be described below. Sense amplifier 19 includes cross coupled FETs 41A, 41B, and biasing FET 41C.

A bit line load isolator 36 is interposed between bit line 17 and node 44A of sense amplifier 19. Bit line isolator 36 is controlled by bit line isolator controller 42. After a read operation, bit line isolator 36 is controlled to provide an automatic refresh of the sensed cell, as described more particularly below.

A sense line load isolator 37 is interposed between sense line 17 and node 44B of sense amplifier 19. Sense line isolator 37 is controlled by sense line isolator controller 43. After a read operation, sense line isolator 37 is controlled to prevent the sense line voltage from falling sufficiently to disturb unselected cells, as described more particularly below.

The memory of FIG. 1 also includes one dummy cell 23 per row. The dummy cell is employed to balance the sense signal for a stored ONE and ZERO. The dummy cell circuitry also includes a dummy word line 31, and an associated dummy word driver 29. Dummy cell 23 is connected to sense line 18. Each dummy cell includes FETs 24 and 27 and capacitor 26. A precharge signal is applied to node 28 as will be described below. In the memory of the present invention dummy cell capacitor 26 has substantially the same capacitance as a cell capacitor 13. Thus the dummy cells are easily fabricated on the same semiconductor substrate with the rest of the array. Moreover, the dummy cell is precharged using the same voltage as is stored for ZERO levels in memory cells 13, thus simplifying the control circuitry associated with the dummy cell. This contrasts with prior art dummy cells, the capacitors of which were either half the size of a memory cell capacitor, or which were precharged with half the voltage of a memory cell capacitor.

Figure 2:
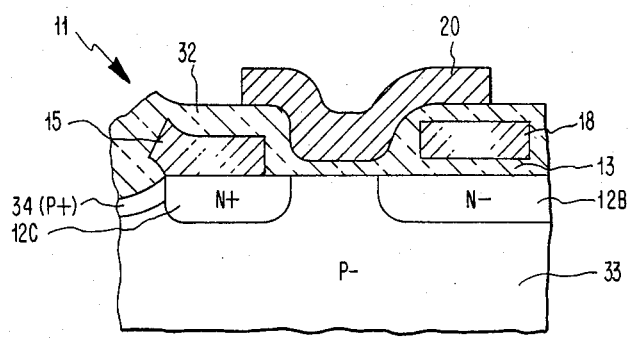
FIG. 2 illustrates an integrated circuit embodiment of a memory cell employed in the random access memory of the present invention.

An integrated circuit embodiment of a memory cell 11 is shown in FIG. 2. Referring now to FIG. 2, the cell is formed on a P- semiconductor substrate 33 using P + isolation 34 between cells. A pair of diffused N regions provide the controlled electrodes 12B, 12C of FET 12. Polysilicon region 15 lies on controlled electrode 12C, so that bit line 17 comprises diffused region 12C and overlying polysilicon region 15. Polysilicon sense line 18 is separated from controlled electrode 12B by a portion 13 of dielectric region 32. That portion 13 of dielectric region 32 forms an integrated capacitor, the plates of which actually comprise controlled electrode 12B and sense line 18. Finally, word line 20 runs perpendicular to bit line 17 and sense line 18. It will be noted that since the combined polysilicon and diffused regions of the bit line have about twice the capacitance per unit length as a corresponding polysilicon region, the bit line capacitance is substantially larger than the sense line capacitance. This unbalanced capacitance further enhances the read signal, as described more fully below.

The embodiment of FIG. 2 was described above with regard to an N type enhancement mode FET. However, it will be understood by those having skill in the art that other devices such as depletion mode FETs, junction FETs, P type enhancement mode FETs or bipolar transistors may be employed. If a bipolar transistor is employed, the base will typically correspond to controlling electrode 12A while the emitter and collector will correspond to controlled electrodes 12B and 12C. Moreover, capacitor 13 may be formed from a second active device (transistor) in a manner well known to those having skill in the art.

Figure 3:
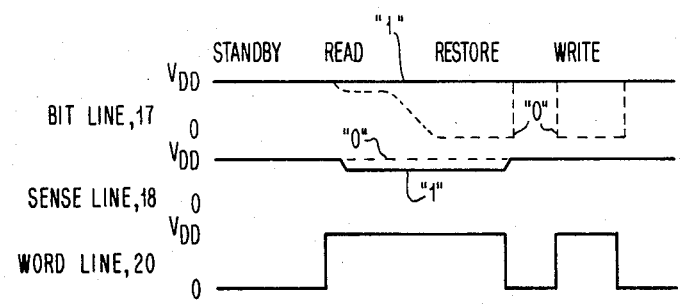
FIG. 3 illustrates voltage waveforms associated with the operation of the memory of FIG. 1.

Referring now to FIG. 3, operation of the memory of the present invention will be described. As understood by those having skill in the art, the present memory may operate using various voltage levels. The present example merely illustrates one method of operation and further illustrates how an enhanced signal is obtained by the memory of the present invention, while avoiding the problem of unselected cell disturbance.

During standby mode, FET 12 is turned off by maintaining word line 20 at 0 V. Bit line 17 and sense line 18 may be maintained at high voltage level, (e.g., at the power supply voltage level, $V_{DD}$) by voltage generating circuits 38, 39, respectively. Controllers 42 and 43 maintain load isolating FETs 36, 37 on, so that bit line 17 is electrically connected to node 44A, while sense line 18 is electrically connected to node 44B. The binary state of a cell is determined by the presence or absence of charge on capacitor 13. For example, the presence of charge on capacitor 13 may indicate binary ZERO while the absence of charge may indicate binary ONE. Thus, for binary ZERO, internal storage node 14 is at about 0 V (capacitor 13 has $V_{DD}$ volts thereacross), while for binary ONE, node 14 is at $V_{DD}$ less the FETs threshold voltage, $V_T$. During the standby mode, dummy cell capacitor 26 is also charged to about 0 V so that capacitor 26 has $V_{DD}$ volts thereacross.

In the standby mode FET 12 has a very high impedance so that the charge on capacitor 13 will not dissipate. Of course, some dissipation always occurs so that the memory must be periodically refreshed by employing techniques well known to those having skill in the art.

Still referring to FIG. 3, the read (sense) operation will now be described. In order to read, bit line 17, sense line 18 and sense amplifier nodes 44A and 44B are maintained at $V_{DD}$ but are floated. This is accomplished by turning off voltage generating means 38 and 39 and sense amplifier FET 41C so that they present a high impedance, and effectively isolate bit line 17, sense line 18 and sense amplifier 19 from any fixed voltages. A selected word line 20 is then raised to $V_{DD}$ to turn on FET 12 and permit the discharge of capacitor 13. At the same time, dummy word line 31 is raised to $V_{DD}$ to turn on FET 24 and permit the discharge of dummy cell capacitor 26 onto sense line 18.

If a binary ONE was previously stored in the selected cell, the voltage of internal storage node 14 does not change and no charge will flow into bit line 17 or sense line 18, from the selected cell. However, charge will flow from dummy cell capacitor 26 onto sense line 18. If, on the other hand, a binary ZERO was previously stored, the voltage at internal storage node 14 will change from 0 V to ($V_{DD}-V_T$). Hence, negative charge will flow from top plate 13A of the selected capacitor 13, through the selected FET 12 and onto bit line 17, so that the voltage on bit line 17 decreases by an amount proportional to the quantity of negative charge. Positive charge will flow from the bottom plate 13b of the selected capacitor 13, and onto sense line 18, so that the voltage on sense line 18 increases by an amount proportional to the quantity of positive charge. However, charge will also flow from dummy cell capacitor 26 onto sense line 18. This charge, obtained from the top plate of dummy cell capacitor 26, is negative and counteracts the positive charge flow onto sense line 18 from the selected cell. In order to cancel the charge flow onto sense line 18, the dummy cell capacitor thus must be equal in value to cell capacitor 13 and have the same internal storage node voltage charge as a memory cell storing a ZERO (i.e., $V_{DD}-V_T$).

The effect of the dummy cell may be summarized by using the well known relationship that charge equals capacitance times voltage. During a read ONE operation bit line 17 remains at $V_{DD}$ while sense line 18 falls due to the action of the dummy cell. The total charge on sense line 18 is equal to $-C_{26}(V_{DD}-V_T)$. During a read ZERO operation, the total charge on bit line 17 is $-C_{13}(V_{DD}-V_T)$ while the total charge on sense line 18 is zero (i.e., $C_{13}(V_{DD}-V_T)$ from the capacitor cell and $-C_{13}(V_{DD}-V_T)$ from the dummy cell). Thus, a read signal will appear on either the bit or sense line for both stored ZERO or ONE. These signals will be equal and opposite provided $C_{13}=C_{26}$ and provided both capacitors have the same voltage ($V_{DD}-V_T$) impressed thereon. Absent dummy cell 23 a stored ONE would provide no signal on either line while a stored ZERO would provide a sense signal on both lines so that sense amplifier 19 could not accurately sense a stored ONE. Finally, it is also seen that dummy cell 23 must be attached to sense line 18, so that it can lower the voltage on sense line 18 below $V_{DD}$ for a stored ONE.

Continuing further with the read operation, when a selected word driver 21 and dummy cell driver 29 are raised to $V_{DD}$, the load isolator controllers 42 and 43 also impress a voltage greater than $V_{DD}+V_T$ on load isolating FETs 36 and 37 so that the FETs are on. Thus the voltage changes on bit line 17 and sense line 18 as a result of the discharge of capacitors 13 and 26 are coupled to nodes 44A and 44B. Sense amplifier 19 is then turned on by turning on FET 41D so that the voltage difference between nodes 44A and 44B is amplified.

As soon as the voltage on bit line 17 and sense line 18 are impressed upon nodes 44A and 44B, respectively, load isolator controllers 42 and 43 turn load isolating FETs 36 and 37 off. However, load isolating FET 36 must be controlled to provide a restore signal while load isolating FET 37 must be controlled to prevent selection of unselected cells, as follows:

Once the bit line signal appears at node 44A, bit line load isolator controller 42 biases bit line load isolating FET 36 to $V_{DD}$ so that FET 36 presents a high impedance. However, for a stored ZERO, node 44A will continue to fall as the sense amplifier amplifies. Once node 44A drops to $V_{DD}-V_T$, FET 36 turns on, so that bit line 17 is pulled down to $V_{DD}-V_T$. As node 44A continues to drop to zero, FET 36 will remain on, so that bit line 17 continues to drop to zero. The voltage across the selected cell capacitor 13 recharges to $V_{DD}$ so that an automatic restore has been accomplished.

In contrast with bit line load isolating FET 36, sense line load isolating FET 37 must be biased to less than $V_T$ after the read operation, in order to avoid disturbing unselected cells, for the following reason: Suppose a binary ONE is being read. Then, during the sense operation, node 44B begins to fall to ground. If FET 37 is turned on as node 44B falls, sense line 18 will also fall to ground. But if sense line 18 falls to ground, the internal storage node 14 of unselected cells having a stored ZERO (i.e., node 14 at 0 V) will be forced to a negative voltage. The unselected cells having a stored ZERO will lose their charge through their transistor 12, which conducts, despite the fact that the associated word line remains at 0 V, due to the forcing of node 14 to a negative voltage. Thus, a stored ZERO is converted to a stored ONE. This may be avoided by controlling sense line isolator 37 so that it remains off during the restore period regardless of how low node 44B falls.

In order to complete the restore operation, the selected word line is returned to 0 V. Bit line voltage generator 38 and sense line voltage generator 39 both impress a voltage of $V_{DD}$ onto nodes 44A, 44B, respectively. Load isolator controllers 42 and 43 turn on FETs 36 and 37, respectively, so that bit line 17 and sense line 18 are returned to $V_{DD}$. The memory is once again in the standby state.

Finally, a write operation will be described. In order to write ONE, bit line 17 and sense line 18 are brought high. Word line 20 is brought high to turn on FET 12 and bring node 14 to $V_{DD}-V_T$ regardless of its previous state. Word line 20 is then brought back to 0 V. To write ZERO, bit line 17 is grounded and word line 20 is brought high, to turn on FET 12 and bring node 14 to ground. Word line 17 is then returned to ground and the bit line returned high.

The following observation will be made with regard to the write operation: If some of the memory cells in an array row were inverted, i.e., by connecting some of the capacitors to the bit line and some of the transistors to the sense line (as was done in the aforesaid Technical Disclosure Bulletin), it is possible to disturb the state of unselected cells during a write operation, for the following reason: when it is desired to write ZERO (charge) into a cell, the FET of which is connected to the sense line (inverted cell), the sense line must be lowered to ground. But if the sense line is lowered to ground, a cell, the capacitor of which is connected to the sense line (a non-inverted cell) having a ZERO written therein will lose its charge and convert to a ONE, because the non-inverted cells' FET will be turned on when the sense line is lowered. This is avoided in the memory of the present invention by tying all the FETs 12 to the bit line 17 and all the capacitors 13 to the sense line 18.

The magnitude of the sense signal will now be derived, and the effect of the values of the bit line and sense line capacitances thereon will be determined. For ease of calculation, the effect of dummy cell 23 will be neglected. However, it will be recognized by those having skill in the art that dummy cell 23 does not affect the total magnitude of the sense signal for stored ONE and ZERO, but merely affects the distribution of the total sense signal between the ONE and ZERO states. Thus, for purposes of deriving the magnitude of the sense signal it will be assumed that no sense signal is present for a stored ONE and that the total sense signal is present for a stored ZERO.

For a stored ZERO, the voltage across capacitor 13 (i.e., $V_{DD}$) discharges to $V_T$, resulting in voltage changes on bit line 17 and sense line 18. The size of these voltage changes may be calculated by applying the conservation of charge theory at internal storage node 14. Thus, the charge entering node 14 through FET 12 must equal the charge leaving node 14 into capacitor 13 and stray capacitor 16. Applying the well known relationship that charge equals capacitance times voltage we obtain:

$$\Delta V_{17} C_{17} = \Delta V_{13} C_{13} + \Delta V_{16} C_{16} \qquad 1).$$

where $\Delta V_{17}$, $\Delta V_{13}$ and $\Delta V_{16}$ equal the voltage changes on bit line 17, across capacitor 13 and across stray capacitor 16, respectively, and $C_{17}$, $C_{13}$ and $C_{16}$ are the capacitances of bit line 17, capacitor 13 and stray capacitance 16, respectively. Since internal storage node 14 changes from 0 V to $V_{DD}-V_T$, the voltage change thereon equals $V_{DD}-V_T$. Stray capacitance 16 also undergoes the same voltage change, as it is also connected to node 14. Thus:

$$\Delta V_{13} = \Delta V_{16} = V_{DD} - V_T \qquad 2)$$

Substituting equation (2) into quation (1), we obtain:

$$\Delta V_{17} C_{17} = (V_{DD} - V_T) C_{13} + (V_{DD} - V_T) C_{16} \qquad 3).$$

Solving for $\Delta V_{17}$ we obtain $$\Delta V_{17} = (V_{DD} - V_T) \frac{(C_{13} + C_{16})}{C_{17}} \qquad 4)$$

It will be noted that equation (4) expresses the total sense signal for prior art one-device memories where the capacitor was grounded, or connected to a fixed potential.

In order to calculate the change on sense line 18 we again start with the well known relationship that voltage equals charge over capacitance. Thus, $$\Delta V_{18} = Q_{18} / C_{18} \qquad 5).$$

where $\Delta V_{18}$ is the voltage change on sense line 18, $C_{18}$ is the sense line capacitance and $Q_{18}$ is the charge on the sense line capacitance. However, because of charge conservation, the charge on the sense line capacitance equals the charge leaving capacitor 13. Thus:

$$Q_{18} = Q_{13} = C_{13}(V_{DD} - V_T) \qquad 6).$$

Substituting for $Q_{18}$ in equation (5) we obtain $$\Delta V_{18} = (V_{DD} - V_T) \frac{C_{13}}{C_{18}} \qquad 7)$$

It will be noted that the voltage changes induced on bit line 17 (equation (4)) and sense line 18 (equation (7)) are opposite in sign. For example, if bit line 17 rises (positive $\Delta V_{17}$), then sense line 18 will fall (negative ΔV$_{18}$) The total sense signal is thus the sum of ΔV$_{17}$ (equation (4)) and ΔV$_{18}$ (equation (7)). Thus, $$V_{19} = \Delta V_{17} + \Delta V_{18} = (V_{DD} - V_T)\left[\frac{C_{13} + C_{16}}{C_{17}} + \frac{C_{13}}{C_{18}}\right] \quad (8)$$

where $V_{19}$ is the total sense signal for the memory of the present invention.

The effect of the bit and sense line capacitances on the total sense signal will now be determined. First, assume that the bit line and sense line capacitances are balanced, e.g., by dividing each line into equal alternating portions of polysilicon and diffused sections as was done in the above-mentioned Technical Disclosure Bulletin. Further, assume that the ratio of storage capacitor 13 to stray capacitance 16 is approximately 20:1, as is typical in one device memories. Substituting these typical values into equation (8) we obtain:

$$V_{19} \cong 2.05(V_{DD} - V_T)\frac{C_{13}}{C_{17}} \quad (9)$$

for the total sense signal when the bit and sense line capacitances are balanced. Comparing equation (9) with equation (4) it is apparent that a sense signal almost twice as large as a grounded capacitor one-device memory is obtained.

Now assume that the bit and sense lines are deliberately unbalanced, such that the total capacitance remains the same, but the bit line capacitance is substantially larger than the sense line capacitance. More particularly, assume that the implementation of FIG. 2, having a diffused bit line and a polysilicon sense line, is employed so that $C_{17} \cong 2C_{18}$. Substituting into equation (8), we obtain:

$$V_{19} \cong 2.28 \frac{C_{13}}{C_{17}} \quad (10)$$

Thus, when the bit and sense lines are deliberately unbalanced, a total sense signal approximately 10% larger than the balanced case is obtained.

In conclusion, a new one-device random access memory has been described. The arrangement provides an enhanced sense signal by connecting the normally grounded capacitor plate to a sense line and differentially sensing the read signal between the bit and sense lines. By connecting all the transistors to the bit line and all the capacitors to the sense line, disruption of unselected cells during a write operation is precluded. Moreover, by preventing the sense line load isolator from turning on during a restore operation, the disruption of unselected cells during restore is precluded. The memory of the present array includes dummy cells, which are easily fabricated with the memory cells. Finally, the bit and sense line capacitances are deliberately made unbalanced, to further enhance the sense signal.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. A memory comprising:
   an array of memory cells arranged in a plurality of rows and a plurality of columns, each memory cell comprising a transistor having a controlling electrode and first and second controlled electrodes, and a charge storage device having first and second plates, said first plate being connected to said first controlled electrode;
   a plurality of word lines, a respective one of which is connected to the controlling electrode of each one of all of the memory cells in a respective column;
   a plurality of bit lines, a respective one of which is connected to the second controlled electrode of each one of all of the memory cells in a respective row;
   a plurality of sense lines, a respective one of which is connected to the second plate of each one of all of the memory cells in a respective row;
   a plurality of differential sensing means having first and second inputs, the first input of a respective one of said differential sensing means being coupled to a respective one of said bit lines and the second input of the respective one of said differential sensing means being coupled to a respective one of said sense lines to which the memory cells in a row are connected;
   means, connected to said word lines, for activating the transistors in a selected column to thereby transfer the charge on the charge storage devices in said selected column onto said bit lines and said sense lines, and onto said first and second inputs;
   first means for electrically connecting said first inputs to said bit lines subsequent to the transfer of charge to said first inputs; and,
   second means for electrically disconnecting said second inputs from said sense lines subsequent to the transfer of charge to said second inputs, said first and second means being controlled independently of each other to thereby transfer charge from said first inputs back to the charge storage devices in said selected column, and to thereby prevent the disturbing of charge storage devices in an unselected column.

2. The memory of claim 1 wherein each of said transistors is a field effect transistor, with the gate being said controlling electrode, either of the source or drain being said first controlled electrode, and the other of said source or drain being said second controlled electrode.

3. The memory of claim 1 wherein said bit and sense lines are generally parallel to each other and orthogonal to said word lines.

4. The memory of claim 1 wherein said second means for electrically disconnecting said second inputs from said sense lines comprises a plurality of sense line load isolators, a respective one of which is connected between the sense line and the second input of a respective row, and a load isolator controller, connected to said sense line load isolators for controlling said sense line load isolators subsequent to the transfer of charge to said second inputs.

5. The memory of claim 1 wherein each of said charge storage devices is a capacitor.

6. The memory of claim 5 wherein said capacitor is formed as an integral part of said first controlled electrode.

7. The memory of claim 5 wherein said capacitor is formed from an active device.

8. A memory comprising:

an array of memory cells arranged in a plurality of rows and a plurality of columns, each memory cell comprising a transistor having a controlling electrode and first and second controlled electrodes, and a charge storage device having first and second plates, said first plate being connected to said first controlled electrode;

a plurality of word lines, a respective one of which is connected to the controlling electrodes of all the memory cells in a respective column;

a plurality of bit lines, a respective one of which is connected to the second controlled electrodes of all the memory cells in a respective row;

a plurality of sense lines, a respective one of which is connected to the second plate of all the memory cells in a respective row, the capacitance of said bit lines being substantially greater than the capacitance of said sense lines;

a plurality of differential sensing means having first and second inputs, the first and second inputs of a respective one of said differential sensing means being coupled to a respective one of said bit and sense lines to which the memory cells in a row are connected;

a plurality of dummy cells, a respective one of which is connected to a respective one of said sense lines, each of said dummy cells comprising a dummy cell capacitor having the same capacitance as a memory cell charge storage device, and means for storing charge on said dummy cell capacitor, the amount of charge being equal to the maximum charge stored on said memory cell charge storage devices;

means, connected to said word lines, for activating the transistors in a selected column to thereby transfer the charge on the charge storage devices in said selected column onto said bit lines and said sense lines and onto said first and second inputs;

means for electrically connecting said first inputs to said bit lines subsequent to the transfer of charge to said first inputs, to thereby transfer charge from said first inputs back to the charge storage devices in said selected column; and means for electrically disconnecting said second inputs from said sense lines subsequent to the transfer of charge to said second inputs, to thereby prevent the disturbing of charge storage devices in an unselected column.

9. The memory of claim 8 wherein said memory is fabricated on a semiconductor substrate and wherein each of said bit lines comprises an elongated diffusion region and each of said sense lines comprises an elongated polysilicon region.

10. The memory of claim 8 wherein said means for electrically disconnecting said second inputs from said sense lines comprises a plurality of sense line load isolators, a respective one of which is connected between the sense line and the second input of a respective row, and a load isolator controller, connected to said sense line load isolators for controlling said sense line load isolators subsequent to the transfer of charge to said second inputs.

11. A memory comprising:
an array of memory cells arranged in a plurality of rows and a plurality of columns, each memory cell comprising a transistor having a controlling electrode and first and second controlled electrodes, and a charge storage device having first and second plates, said first plate being connected to said first controlled electrode;

a plurality of word lines, a respective one of which is connected to the controlling electrode of each one of all of the memory cells in a respective column;

a plurality of bit lines, a respective one of which is connected to the second controlled electrode of each one of all the memory cells in a respective row;

a plurality of sense lines, a respective one of which is connected to the second plate of each one of all of the memory cells in a respective row;

a plurality of differential sensing means each having first and second inputs, the first input of a respective one of said differential sensing means being coupled to a respective one of said bit lines and the second input of said respective one of said differential sensing means being coupled to a respective one of said sense lines to which the memory cells in a row are connected; and means connected to said word lines, for activating the transistors in a selected column to thereby transfer the charge on the charge storage devices in said selected column onto said bit lines and said sense lines, and onto said first and second inputs;

said memory being fabricated on a semiconductor substrate, with the capacitance of said sense lines being substantially smaller than the capacitance of said bit lines.

12. The memory of claim 8 to 11 wherein the capacitance of said bit lines is twice as large as the capacitance of said sense lines.

13. A memory comprising:
an array of memory cells arranged in a plurality of rows and a plurality of columns, each memory cell comprising a transistor having a controlling electrode and first and second controlled electrodes, and a charge storage device having first and second plates, said first plate being connected to said first controlled electrode;

a plurality of word lines, a respective one of which is connected to the controlling electrode of each one of all of the memory cells in a respective column;

a plurality of bit lines, a respective one of which is connected to the second controlling electrode of each one of all of the memory cells in a respective row;

a plurality of sense lines, a respective one of which is connected to the second plate of each one of all of the memory cells in a respective row;

a plurality of differential sensing means each having first and second inputs, the first input of a respective one of said differential sensing means being coupled to a respective one of said bit lines and the second input of said respective one of said differential sensing means being coupled to a respective one of said sense lines to which the memory cells in a row are connected;

means, connected to said word lines, for activating the transistors in a selected column to thereby transfer the charge on the charge storage devices in said selected column onto said bit lines and said sense lines, and onto said first and second inputs; and, a plurality of dummy cells, a respective one of which is connected to a respective one of said sense lines, each of said dummy cells comprising:

a dummy cell capacitor having substantially the same capacitance as a memory cell charge storage device; and, means for storing charge on said dummy cell capacitor, the amount of charge being substantially equal to the maximum charge stored on said memory cell charge storage devices.

14. A memory comprising:

an array of memory cells arranged in a plurality of rows and a plurality of columns, each memory cell comprising a transistor having a controlling electrode and first and second controlled electrodes, and a charge storage device having first and second plates, said first plate being connected to said first controlled electrode;

a plurality of word lines, a respective one of which is connected to the controlling electrode of each one of all of the memory cells in a respective column;

a plurality of bit lines, a respective one of which is connected to the second controlled electrode of each one of all of the memory cells in a respective row;

a plurality of sense lines, a respective one of which is connected to the second plate of each one of all of the memory cells in a respective row;

a plurality of differential sensing means each having first and second inputs, the first input of a respective one of said differential sensing means being coupled to a respective one of said bit lines and the second input of said respective one of said differential sensing means being coupled to a respective one of said sense lines to which the memory cells in a row are connected; and, means, connected to said word lines, for activating the transistors in a selected column to thereby transfer the charge on the charge storage devices in said selected column onto said bit lines and said sense lines, and onto said first and second inputs;

said memory being fabricated on a semiconductor substrate with each of said bit lines comprising an elongated diffusion region and each of said sense lines comprising an elongated polysilicon region with the capacitance of said sense lines being substantially smaller than the capacitance of said bit lines.

15. The memory of claim 8, 11, 13 or 14 wherein each of said transistors is a field effect transistor, with the gate being said controlling electrode, either of the source or drain being said first controlled electrode, and the other of said source or drain being said second controlled electrode.

16. The memory of claim 8, 11, 13 or 14 wherein said bit and sense lines are generally parallel to each other and orthogonal to said word lines.

17. The memory of claim 8, 11, 13 or 14 wherein each of said charge storage devices is a capacitor.

18. The memory of claim 17 wherein said capacitor is formed as an integral part of said first controlled electrode.

19. The memory of claim 17 wherein said capacitor is formed from an active device.

* * * * *